United States Patent
Kung et al.

(10) Patent No.: US 10,490,341 B2
(45) Date of Patent: Nov. 26, 2019

(54) ELECTRICAL DEVICE

(71) Applicant: Advanced Semiconductor Engineering, Inc., Kaohsiung (TW)

(72) Inventors: Cheng-Yuan Kung, Kaohsiung (TW); Hung-Yi Lin, Kaohsiung (TW); Teck-Chong Lee, Kaohsiung (TW); Sheng-Chi Hsieh, Kaohsiung (TW); Chien-Hua Chen, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 308 days.

(21) Appl. No.: 15/680,059

(22) Filed: Aug. 17, 2017

(65) Prior Publication Data
US 2019/0057809 A1   Feb. 21, 2019

(51) Int. Cl.
| | |
|---|---|
| H01H 9/00 | (2006.01) |
| H01F 27/40 | (2006.01) |
| H01F 21/12 | (2006.01) |
| H01F 27/28 | (2006.01) |
| H01F 27/29 | (2006.01) |
| H01L 25/16 | (2006.01) |
| H01G 5/00 | (2006.01) |
| H03H 7/38 | (2006.01) |
| H03H 1/00 | (2006.01) |

(52) U.S. Cl.
CPC ............. *H01F 27/40* (2013.01); *H01F 21/12* (2013.01); *H01F 27/2847* (2013.01); *H01F 27/29* (2013.01); *H01G 5/00* (2013.01); *H01L 25/16* (2013.01); *H01F 2021/125* (2013.01); *H03H 7/38* (2013.01); *H03H 2001/0085* (2013.01)

(58) Field of Classification Search
None
See application file for complete search history.

(56) References Cited

U.S. PATENT DOCUMENTS

| | | | |
|---|---|---|---|
| 5,808,527 A * | 9/1998 | De Los Santos | H01P 1/127 333/205 |
| 5,914,695 A * | 6/1999 | Liu | H01Q 9/285 343/795 |
| 5,952,896 A | 9/1999 | Mett et al. | |
| 7,838,964 B2 | 11/2010 | Carobolante et al. | |

(Continued)

*Primary Examiner* — Stephen W Jackson
(74) *Attorney, Agent, or Firm* — Foley & Lardner LLP; Cliff Z. Liu (57) ABSTRACT

An electrical device comprises a substrate, a first dielectric layer, a first die, an adjustable inductor and a second die. The substrate has a first surface. The first dielectric layer is disposed on the first surface of the substrate and has a first surface. The first die is surrounded by the first dielectric layer. The adjustable inductor is electrically connected to the first die. The adjustable inductor comprises a plurality of pillars surrounded by the first dielectric layer, a plurality of first metal strips disposed on the first surface of the first dielectric layer and electrically connected to the pillars, and a plurality of second metal strips disposed on the first surface of the first dielectric layer and electrically connected to the pillars. A width of at least one of the second metal strips is different than a width of at least one of the first metal strips. The second die is electrically connected to the adjustable inductor.

22 Claims, 7 Drawing Sheets

(56) References Cited

U.S. PATENT DOCUMENTS 7,894,205 B2 * 2/2011 Lee .................. H01L 27/016
                                                  361/268
8,138,876 B2 * 3/2012 Ding .................. H01F 21/005
                                                  257/531

* cited by examiner

ELECTRICAL DEVICE

BACKGROUND

1. Technical Field

The present disclosure relates to an electrical device, and to an electrical device including adjustable capacitors and adjustable inductors.

2. Description of the Related Art

In a semiconductor device package, passive components (such as an inductor or a capacitor) can be used for impedance matching. However, a size of the passive components may adversely affect miniaturization of the semiconductor device package.

One possible solution to this problem is to embed the passive components in a semiconductor substrate. However, it may be difficult to readily configure, modify or replace such embedded passive components for impedance matching.

SUMMARY

In one or more embodiments, according to one aspect, an electrical device includes a substrate, a first dielectric layer, a first die, an adjustable inductor and a second die. The substrate has a first surface. The first dielectric layer is disposed on the first surface of the substrate and has a first surface. The first die is surrounded by the first dielectric layer. The adjustable inductor is electrically connected to the first die. The adjustable inductor includes a plurality of pillars surrounded by the first dielectric layer, a plurality of first metal strips disposed on the first surface of the first dielectric layer and electrically connected to the pillars, and a plurality of second metal strips disposed on the first surface of the first dielectric layer and electrically connected to the pillars. A width of at least one of the second metal strips is different than a width of at least one of the first metal strips. The second die is electrically connected to the adjustable inductor.

In one or more embodiments, according to another aspect, an electrical device includes a substrate, a first adjustable capacitor, a first dielectric layer, a second dielectric layer, a first die, a first adjustable inductor and a second die. The substrate has a first surface. The first adjustable capacitor is disposed on the substrate. The first dielectric layer is disposed on the first surface of the substrate. The first dielectric layer surrounds the first adjustable capacitor. The second dielectric layer is disposed on the first dielectric layer. The first die is electrically connected to the first adjustable capacitor. The first adjustable inductor is electrically connected to the first adjustable capacitor. The first adjustable inductor includes a plurality of pillars. Each of the pillars is surrounded by the second dielectric layer. The second die is electrically connected to the first adjustable inductor.

In one or more embodiments, according to another aspect, an electrical device includes a substrate, a first adjustable capacitor, a first die, a first adjustable inductor and a second die. The substrate has a first surface. The first adjustable capacitor is disposed on the first surface of the substrate. The first die is electrically connected to the first adjustable capacitor. The first adjustable inductor is electrically connected to the first adjustable capacitor. The first adjustable inductor includes a spiral structure that spirals around a first axis. The first axis passes through the first adjustable capacitor. The second die is electrically connected to the first adjustable inductor.

BRIEF DESCRIPTION OF THE DRAWINGS

Common reference numerals are used throughout the drawings and the detailed description to indicate the same or similar elements. Embodiments of the present disclosure will be readily understood from the following detailed description taken in conjunction with the accompanying drawings.

DETAILED DESCRIPTION

Described in this disclosure are techniques for providing an electrical device that includes adjustable capacitors and adjustable inductors.

Spatial descriptions, including such terms as "above," "below," "up," "left," "right," "down," "top," "bottom," "vertical," "horizontal," "side," "higher," "lower," "upper," "over," "under," and so forth, are used herein with respect to an orientation shown in corresponding figures unless otherwise specified. It should be understood that the spatial descriptions used herein are for purposes of illustration, and that practical implementations of the structures described herein can be spatially arranged in any orientation or manner, provided that the merits of embodiments of this disclosure are not deviated from by such arrangement.

Figure 1:
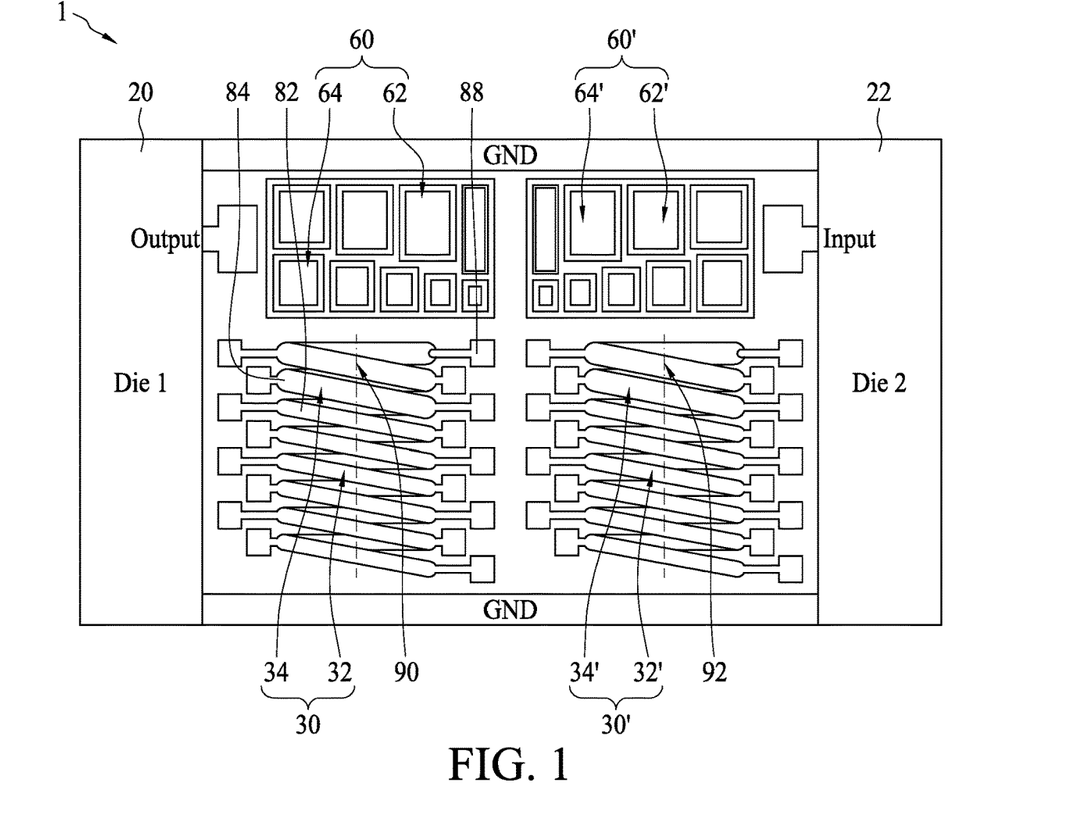
FIG. 1 is a top view of an electrical device in accordance with some embodiments of the present disclosure.

FIG. 1 is a top view of an electrical device 1 in accordance with some embodiments of the present disclosure. The electrical device 1 includes die 20 (also referred to as "die 1") and die 22 (also referred to as "die 2"), adjustable inductors 30 and 30', and adjustable capacitors 60 and 60'.

In one or more embodiments, the adjustable capacitor 60 includes at least two capacitors 62 and 64. The capacitance of the capacitor 62 is different from the capacitance of capacitor 64. The effective capacitance of the adjustable capacitor 60 may be adjusted by selecting different combinations of electrical connection of the capacitors included in the adjustable capacitor 60. In one or more embodiments, the adjustable capacitor 60' includes at least two capacitors 62' and 64'. The capacitance of the capacitor 62' is different from the capacitance of capacitor 64'. The effective capacitance of the adjustable capacitor 60' may be adjusted by selecting different combinations of electrical connection of the capacitors included in the adjustable capacitor 60'.

In one or more embodiments, the adjustable capacitor 60 is electrically connected to the die 20 and the adjustable capacitor 60' is electrically connected to the die 22. The adjustable capacitor 60 is disposed adjacent to the die 20, and the adjustable capacitor 60' is disposed adjacent to the die 22. The adjustable capacitor 60 is disposed adjacent to the adjustable capacitor 60'. The adjustable capacitor 60 may be disposed between the adjustable capacitor 60' and the die 20. The adjustable capacitor 60' may be disposed between the adjustable capacitor 60 and the die 22.

Figure 4:
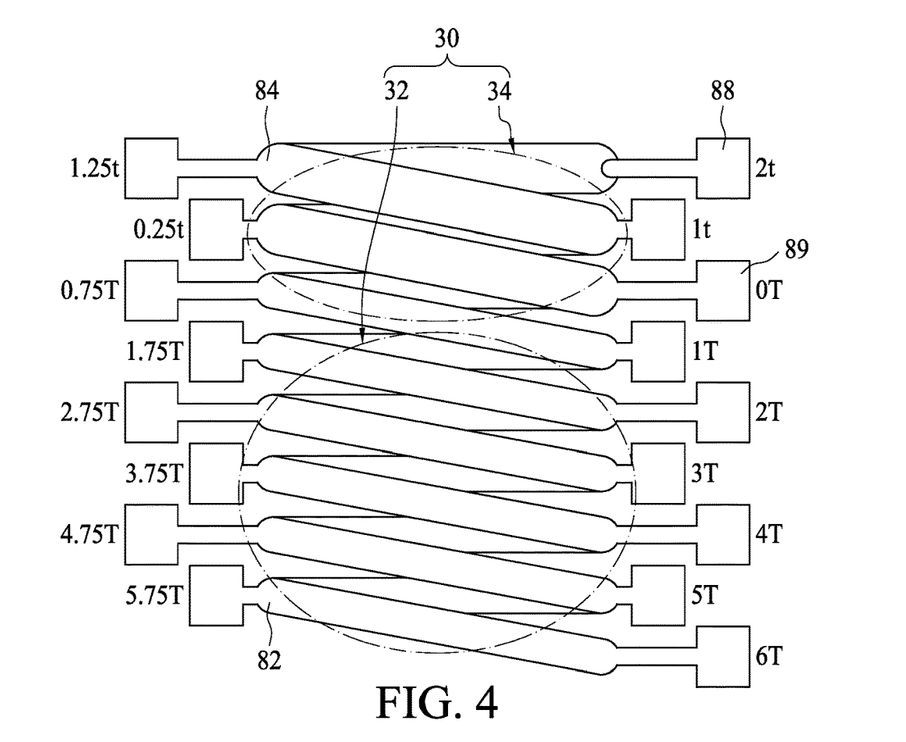
FIG. 4 is a top view of an adjustable inductor in accordance with some embodiments of the present disclosure.

In some embodiments, the adjustable inductors 30 and 30' are electrically connected to each other. The adjustable inductor 30 is adjacent to the die 20 and the adjustable inductor 30' is adjacent to the die 22. In one or more embodiments, the adjustable inductor 30 is electrically connected to the adjustable capacitor 60 and the adjustable inductor 30' is electrically connected to the adjustable capacitor 60'. The adjustable inductor 30 includes a conductive spiral structure that spirals around an axis 90. The axis 90 passes through the adjustable capacitor 60. The adjustable inductor 30' includes a conductive spiral structure that spirals around an axis 92. The axis 92 passes through the adjustable capacitor 60'. In one or more embodiments, the axis 90 is substantially parallel to the axis 92. In one or more embodiments, the electrical device 1 may include more than two adjustable capacitors and adjustable inductors. The adjustable inductors 30 and 30' and adjustable capacitors 60 and 60' of a semiconductor structure may provide for flexibility during impedance matching. The adjustable inductor 30 may include a region 32 that includes metal strips, and may include a region 34 that includes metal strips thicker than those of the region 32 (as shown in FIG. 4). The adjustable inductor 30' may include regions 32' and 34' that are respectively similar to the region 32 and the region 34.

Figure 2:
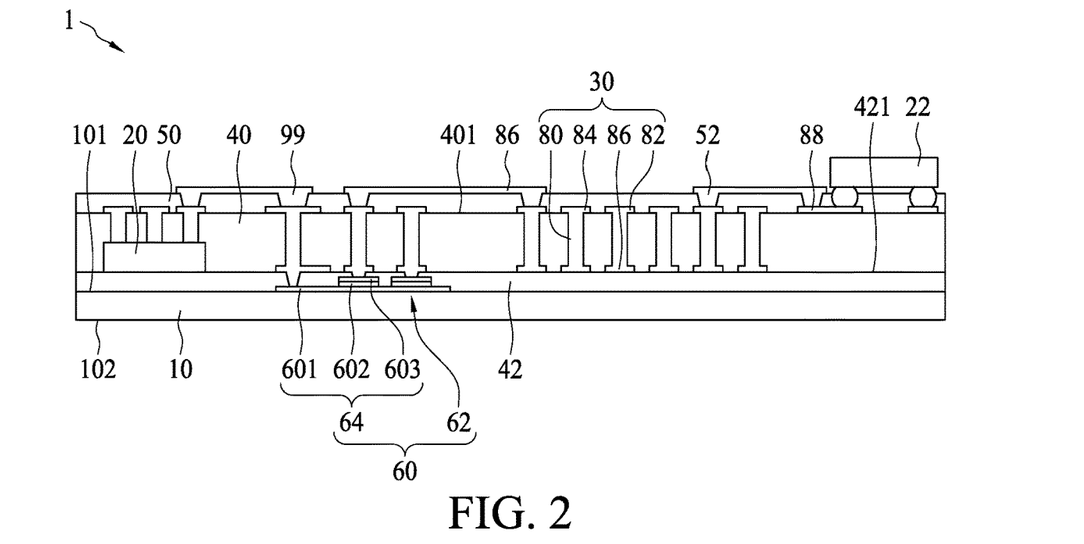
FIG. 2 is a cross-sectional view of the electrical device shown in FIG. 1.

FIG. 2 is a cross-sectional view of the electrical device 1 shown in FIG. 1. The electrical device 1 includes a substrate 10, dielectric layers 40 and 42, a passivation layer 50, a die 20 and a die 22, an adjustable inductor 30, an adjustable capacitor 60 and conductive interconnect structures 99. The adjustable inductor 30' and adjustable capacitor 60' may be included in the electrical device 1, but are not shown. The dielectric layer 40 may support a plurality of pillars 80, and one or more metal strips 82, and one or more metal strips 84, described in detail below. The structure of the adjustable capacitor 60 is similar to the structure of the adjustable capacitor 60'. The structure of the adjustable inductor 30 is similar to the structure of the adjustable inductor 30'. The adjustable inductors 30 and 30' and adjustable capacitors 60 and 60' of a semiconductor structure can provide for reducing the thickness of the electrical device 1. In one or more embodiments, the adjustable capacitor 60' is electrically connected to the adjustable inductor 30 and the adjustable capacitor 60 is electrically connected to the adjustable inductor 30 and the adjustable inductor 30'.

The substrate 10 includes a glass, silicon, silicon dioxide ($SiO_2$), or a combination thereof. The substrate 10 has a top surface 101 and a surface 102 opposite to the surface 101. The dielectric layer 42 is disposed on the surface 101 of the substrate 10. The dielectric layer 42 has a top surface 421. The dielectric layer 40 is disposed on the top surface 421 of the dielectric layer 42. The die 20 is surrounded by the dielectric layer 40. The dielectric layer 40 has a top surface 401. The die 20 is electrically connected to the adjustable capacitor 60. The adjustable inductor 30 is electrically connected to the adjustable capacitor 60. The die 22 is electrically connected to the adjustable inductor 30.

In some embodiments, the dielectric layer 40 includes a suitable insulating material. For example, the dielectric layer 40 may include an inorganic film (such as a silicon nitride ($SiN_x$) film or an oxide film) or an organic film (such as a polyimide film); however, other suitable materials may be additionally or alternatively used.

The adjustable inductor 30 is electrically connected to the die 20. The adjustable inductor 30 is disposed on the dielectric layer 42. In some embodiments, the adjustable inductor 30 includes the plurality of pillars 80 surrounded by the dielectric layer 40, a plurality of the metal strips 82 disposed on the surface 401 of the dielectric layer 40 and electrically connected to the plurality of pillars 80, a plurality of the metal strips 84 disposed on the surface 401 of the dielectric layer 40 and electrically connected to the plurality of pillars 80 and a plurality of metal strips 86 disposed on the top surface 421 of the dielectric layer 42. Each of the metal strips 82 is connected to a respective one of the metal strips 86 by a respective one of the pillars 80. The adjustable inductor 30 includes the plurality of metal strips 86 disposed on the surface 421 of the dielectric layer 42. The metal strips 84 may have a substantially same width. The metal strips 82 may have a substantially same width. The width of the metal strips 84 may differ from the width of the metal strips 82 (e.g. the width of the metal strips 84 may be greater than the width of the metal strips 82).

In some embodiments, a width of one pillar 80 of the plurality of pillars 80 corresponding to a metal strip 84 (e.g. a pillar 80 on which the metal strip 84 is disposed) is greater than a width of another of pillar 80 the plurality of pillars 80 corresponding to the metal strip 82 (e.g. a pillar 80 on which the metal strip 82 is disposed). In some embodiments, the width of the pillar 80 corresponding to the metal strip 84 is substantially the same as the width of the plurality of pillar 80 corresponding to the metal strip 82.

In some embodiments, each of the pillars 80 is surrounded by the dielectric layer 40. The pillars 80, and the metal strips 82, 84 and 86 include one or more of aluminum (Al), copper (Cu), another, metal, or an alloy thereof (such as AlCu).

The adjustable inductor 30 includes a contact pad 88 disposed on the surface 401 of the dielectric layer 40. The contact pad 88 is electrically connected to at least one of the metal strips 82 and/or at least one of the metal strips 84. The adjustable inductor 30 is covered, at least in part, by the passivation layer 50. The passivation layer 50 defines an opening 52 exposing the contact pad 88. The contact pad 88 includes one or more of Al, Cu, another metal, or an alloy thereof (such as AlCu). A conductive interconnect structure 99 may be disposed on the passivation layer 50.

The adjustable capacitor 60 includes capacitors 62 and 64. The adjustable capacitor 60 is disposed on the surface 101 of the substrate 10 and surrounded by the dielectric layer 42. The structure of the capacitor 62 is similar to the structure of the capacitor 64. In one or more embodiments, the capacitor 64 includes a bottom electrode 601, an insulation layer 602 disposed on the bottom electrode 601, and a top electrode 603 disposed on the insulation layer 602. The capacitor 62 may also include a bottom electrode 601, an insulation layer 602 disposed on the bottom electrode 601, and a top electrode 603. The capacitor 62 may include a same bottom electrode 601 as does the capacitor 64.

Figure 3:
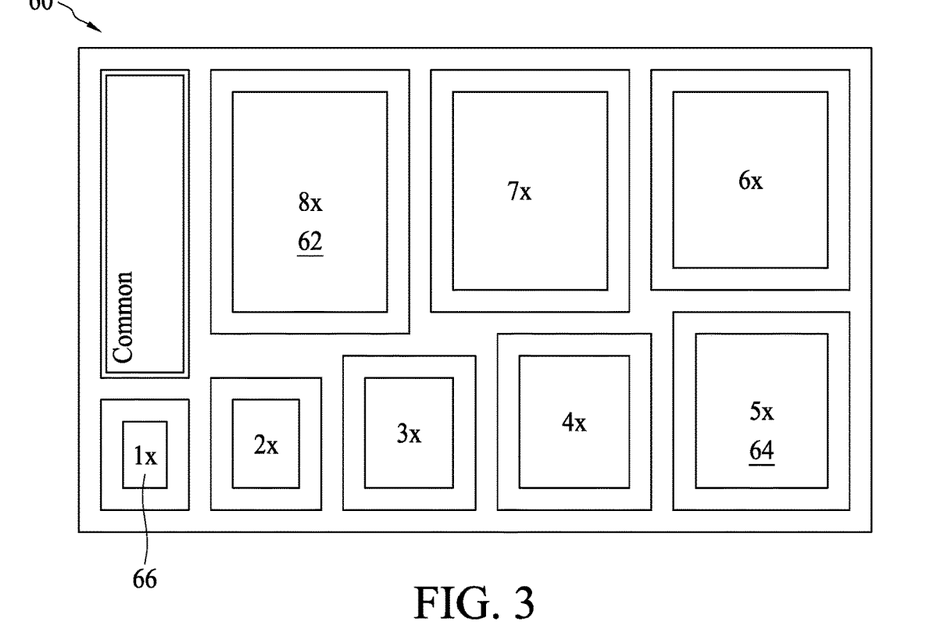
FIG. 3 is a top view of an adjustable capacitor in accordance with some embodiments of the present disclosure.

FIG. 3 is a top view of an adjustable capacitor 60 in accordance with some embodiments of the present disclosure. The adjustable capacitor 60 in FIG. 3 includes eight capacitors, including capacitors 62, 64, and a capacitor 66, as well as other capacitors. In one or more embodiments, the adjustable capacitor 60 may include up to two capacitors 62 and 64. The capacitance of the capacitors may be substantially proportional to an area of an electrode of the capacitors. The capacitors shown in FIG. 3 are labeled to show the relative sizes of an area of each capacitor's electrode—for example, the capacitor 62 includes an electrode that has an area eight times as large as an area of an electrode of the capacitor 66. The capacitance of the capacitor 62 may thus be about eight times that of the capacitance of the capacitor 66. In other embodiments, the capacitors may include an electrode that has an area that is not an integral multiple of an area of an electrode of a smallest capacitor, but is some other multiple of such an area. In one or more embodiments, the adjustable capacitor 60 may include more than eight capacitors. The effective capacitance of the adjustable capacitor 60 may be adjusted by electrically connecting different combinations of the capacitors.

FIG. 4 is a top view of an adjustable inductor 30 in accordance with some embodiments of the present disclosure. In one or more embodiments, the adjustable inductor 30 shown in FIG. 4 includes pads 0.25t, 1t, 1.25t, 2t, 0T, 0.75T, 1T, 1.75T, 2.75T, 2T, 3T, 3.75T, 4T, 4.75T, 5T, 5.75T, and 6T. Pads 2t and 0T may also be referred to as pad 88 and pad 89, respectively. The adjustable inductor 30 further includes metal strips 82, metal strips 84, and pillars 80 (not shown). A width of one of the metal strips 84 is different than a width of one of the metal strips 82. A width of one of the pillars 80 corresponding to the metal strip 84 is greater than a width of another of the pillars 80 corresponding to the metal strip 82. The effective inductance of the adjustable inductor 30 may be adjusted by electrically connecting different combinations of the pads.

Figure 5A:
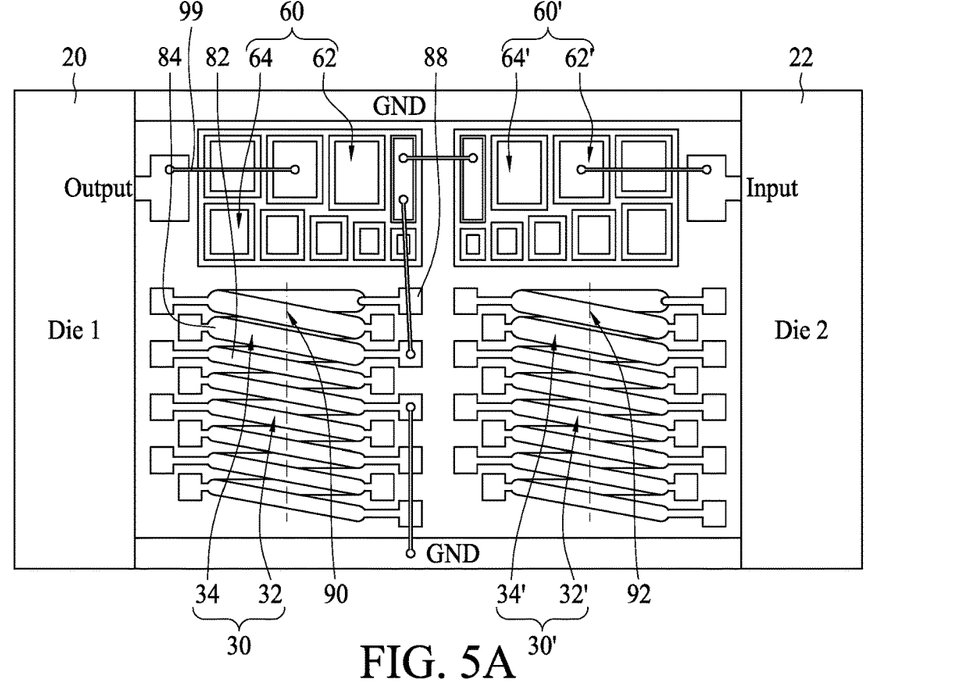
FIG. 5A and FIG. 5B are top views of an electrical device in accordance with some embodiments of the present disclosure.

FIG. 5A is a top view of an electrical device 1 in accordance with some embodiments of the present disclosure. The adjustable capacitor 60 is electrically connected to an output electrode through a first conductive interconnect structure 99. The output electrode is electrically connected to the die 20. The adjustable capacitor 60' is electrically connected to an input electrode through a second conductive interconnect structure 99. The input electrode is electrically connected to the die 22. The adjustable capacitor 60' is electrically connected to the adjustable capacitor 60. The adjustable capacitor 60 is electrically connected to the adjustable inductor 30. The adjustable inductor 30 is electrically connected to a ground. These electrical connections may be implemented, for example, through conductive interconnect structures 99.

Figure 5B:
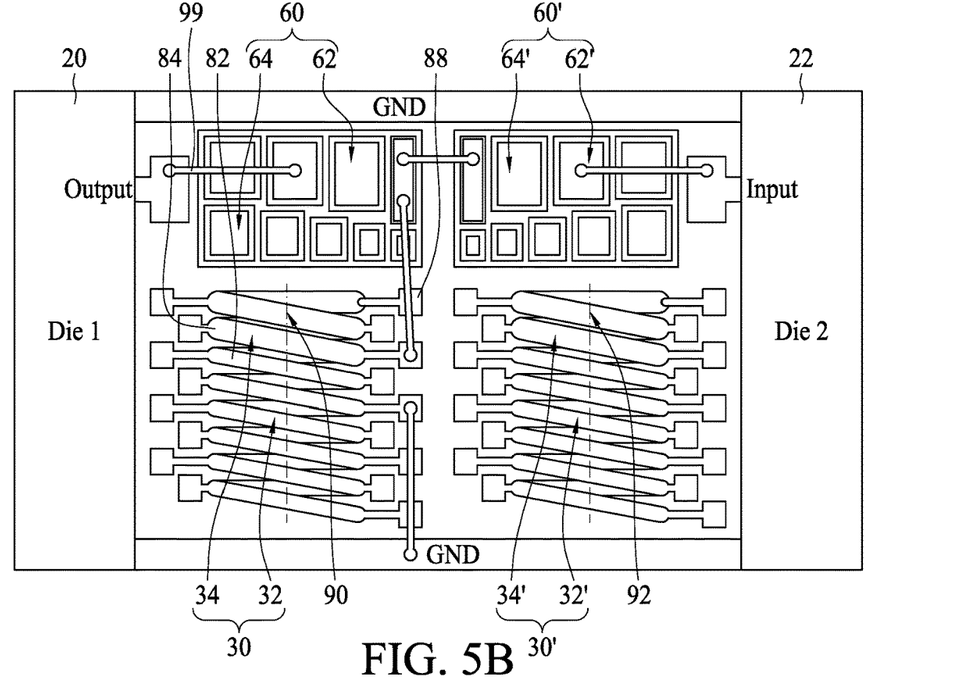

FIG. 5B is a top view of an electrical device 1 in accordance with some embodiments of the present disclosure. The circuit structure of the electrical device 1 in FIG. 5B is similar to the circuit structure of the electrical device 1 in FIG. 5A, except that a thickness and/or width of the conductive interconnect structures 99 shown in FIG. 5B are greater than a thickness and/or width of the conductive interconnect structures 99 shown in FIG. 5A.

Figure 5C:
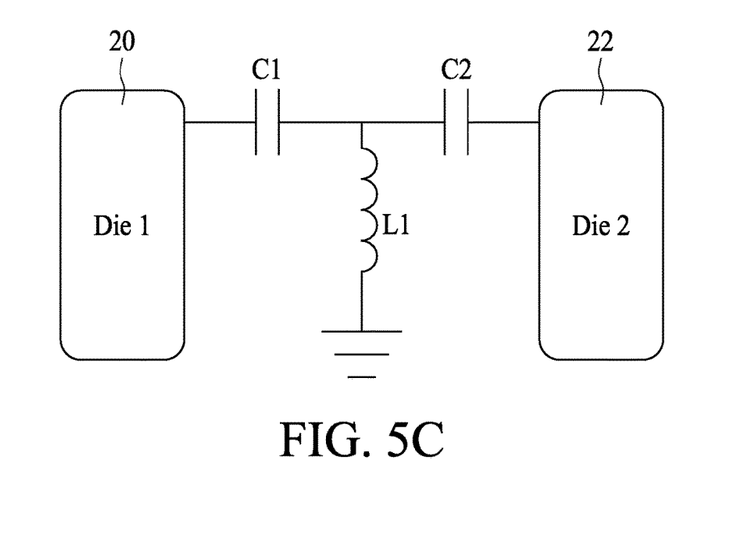
FIG. 5C is a schematic circuit diagram of the electrical device shown in FIG. 5A.

FIG. 5C is a schematic circuit diagram of the electrical device 1 shown in FIG. 5A. Capacitors C1 and C2, which may respectively correspond to the adjustable capacitors 60 and 60', are connected in series. One end of an inductor L1, which may correspond to at least one of the adjustable inductors 30 and 30', is connected to a node between the series-connected capacitors C1 and C2, and another end of the inductor L1 is connected to a ground. The circuit combination of capacitors C1 and C2 and inductor L1 may be connected between the dies 20 and 22, and the capacitances and inductance values of those components may be set to adjust an impedance between the dies 20 and 22 (e.g. for impedance matching).

Figure 6A:
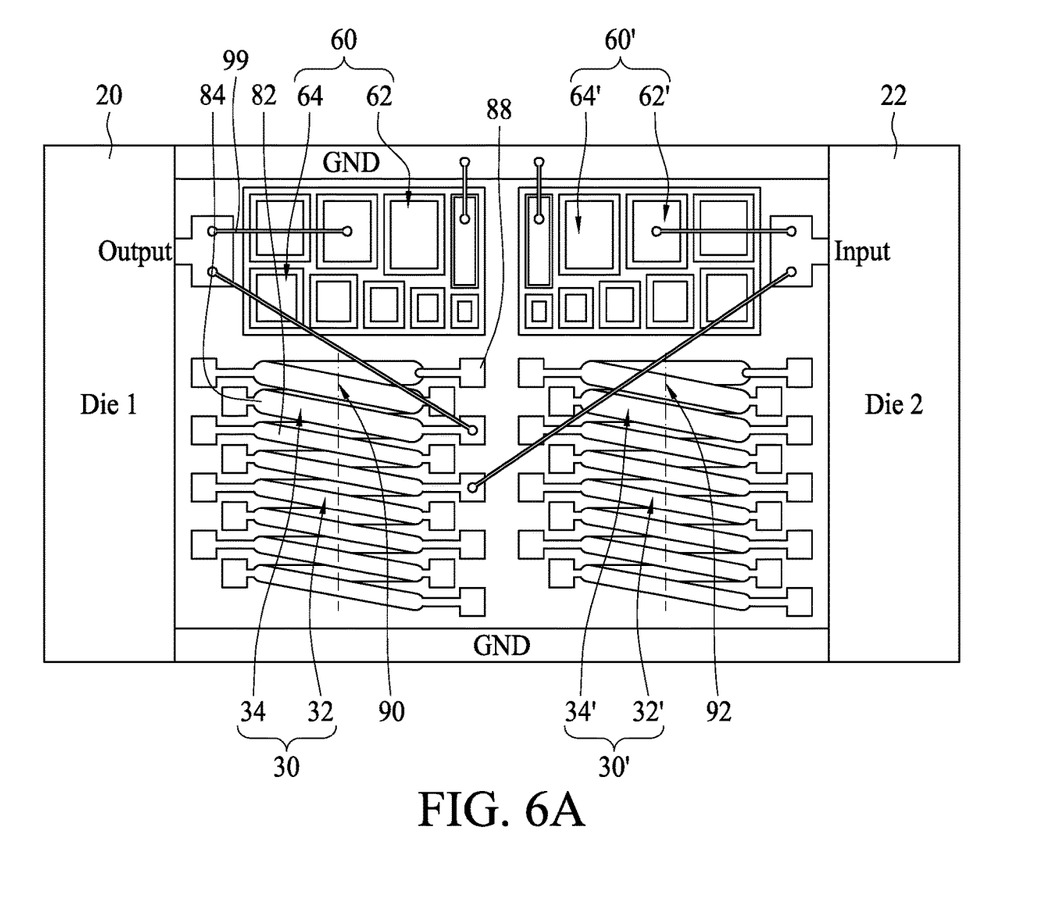
FIG. 6A is a top view of an electrical device in accordance with some embodiments of the present disclosure.

FIG. 6A is a top view of an electrical device 1 in accordance with some embodiments of the present disclosure. The adjustable capacitor 60 is electrically connected to an output electrode through a first conductive interconnect structure 99. The output electrode is electrically connected to the die 20. The adjustable capacitor 60' is electrically connected to an input electrode through a second conductive interconnect structure 99. The input electrode is electrically connected to the die 22. The adjustable capacitors 60 and 60' are each electrically connected to the adjustable inductor 30. The adjustable capacitors 60 and 60' are each electrically connected to the ground. These electrical connections may be implemented, for example, through conductive interconnect structures 99.

Figure 6B:
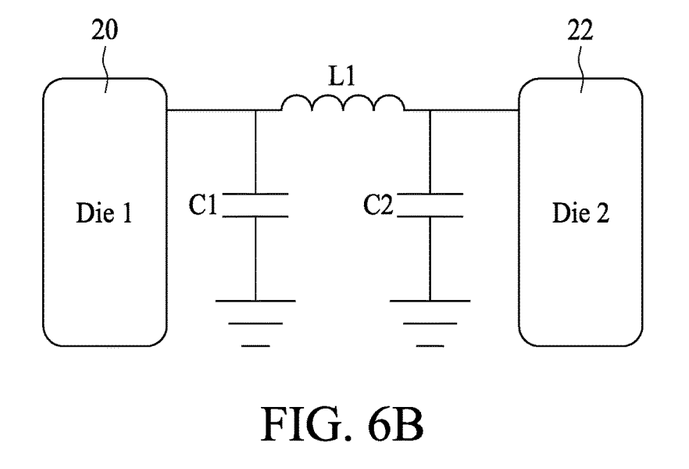
FIG. 6B is a schematic circuit diagram of the electrical device shown in FIG. 6A.

FIG. 6B is a schematic circuit diagram of the electrical device 1 shown in FIG. 6A. Capacitors C1 and C2, which may respectively correspond to the adjustable capacitors 60 and 60', are connected in parallel between an inductor L1, which may correspond to at least one of the adjustable inductors 30 and 30', and a ground. The circuit combination of capacitors C1 and C2 and inductor L1 may be connected between the dies 20 and 22, and the capacitances and inductance values of those components may be set to adjust an impedance between the dies 20 and 22 (e.g. for impedance matching).

Figure 7A:
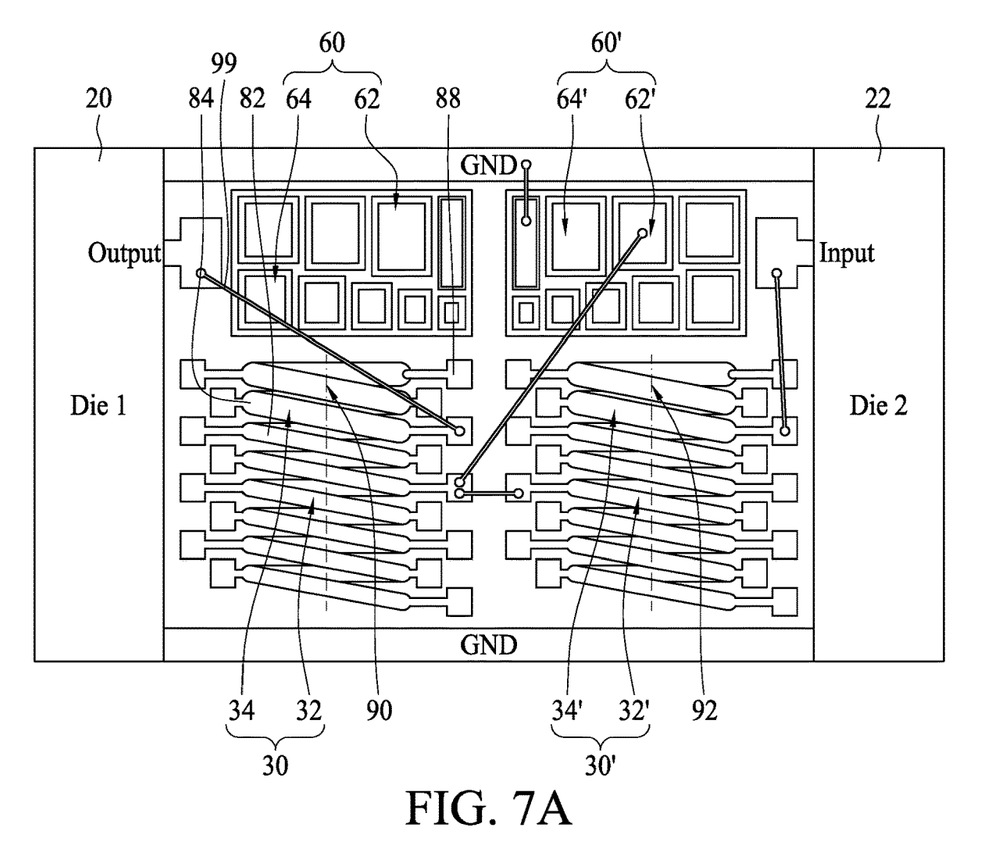
FIG. 7A is a top view of an electrical device in accordance with some embodiments of the present disclosure.

FIG. 7A is a top view of an electrical device 1 in accordance with some embodiments of the present disclosure. The adjustable inductor 30 is electrically connected to an output electrode through a first conductive interconnect structure 99. The adjustable inductor 30' is electrically connected to an input electrode through a second conductive interconnect structure 99. The adjustable inductor 30 is electrically connected to the adjustable inductor 30'. The adjustable inductor 30 is electrically connected to the adjustable capacitor 60'. These electrical connections may be implemented, for example, through conductive interconnect structures 99. The adjustable capacitor 60' is electrically connected to a ground through a third conductive interconnect structure 99.

Figure 7B:
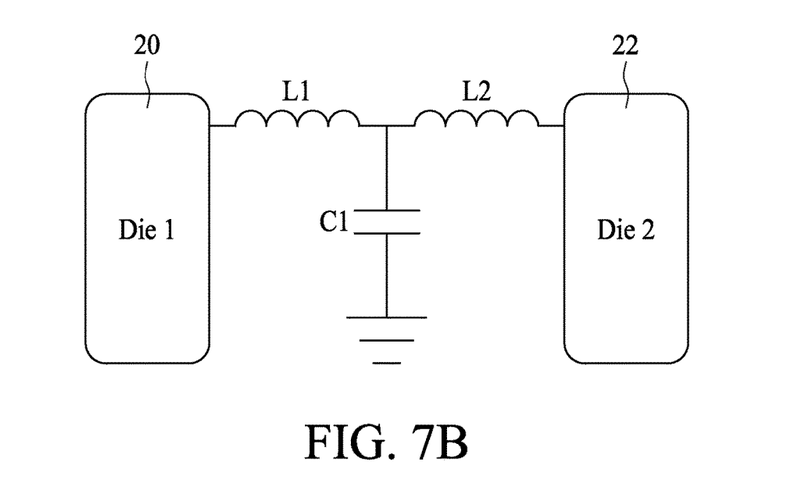
FIG. 7B is a schematic circuit diagram of the electrical device shown in FIG. 7A.

FIG. 7B is a schematic circuit diagram of the electrical device shown in FIG. 7A. Inductors L1 and L2, which may respectively correspond to the adjustable inductors 30 and 30', are connected in series. One end of a capacitor C1, which may correspond to at least one of the adjustable capacitors 60 and 60', is connected to a node between the inductors L1 and L2, and another end of the capacitor C1 is connected to a ground. The circuit combination of capacitor C1 and inductors L1 and L2 may be connected between the dies 20 and 22, and the capacitances and inductance values of those components may be set to adjust an impedance between the dies 20 and 22 (e.g. for impedance matching).

Figure 8A:
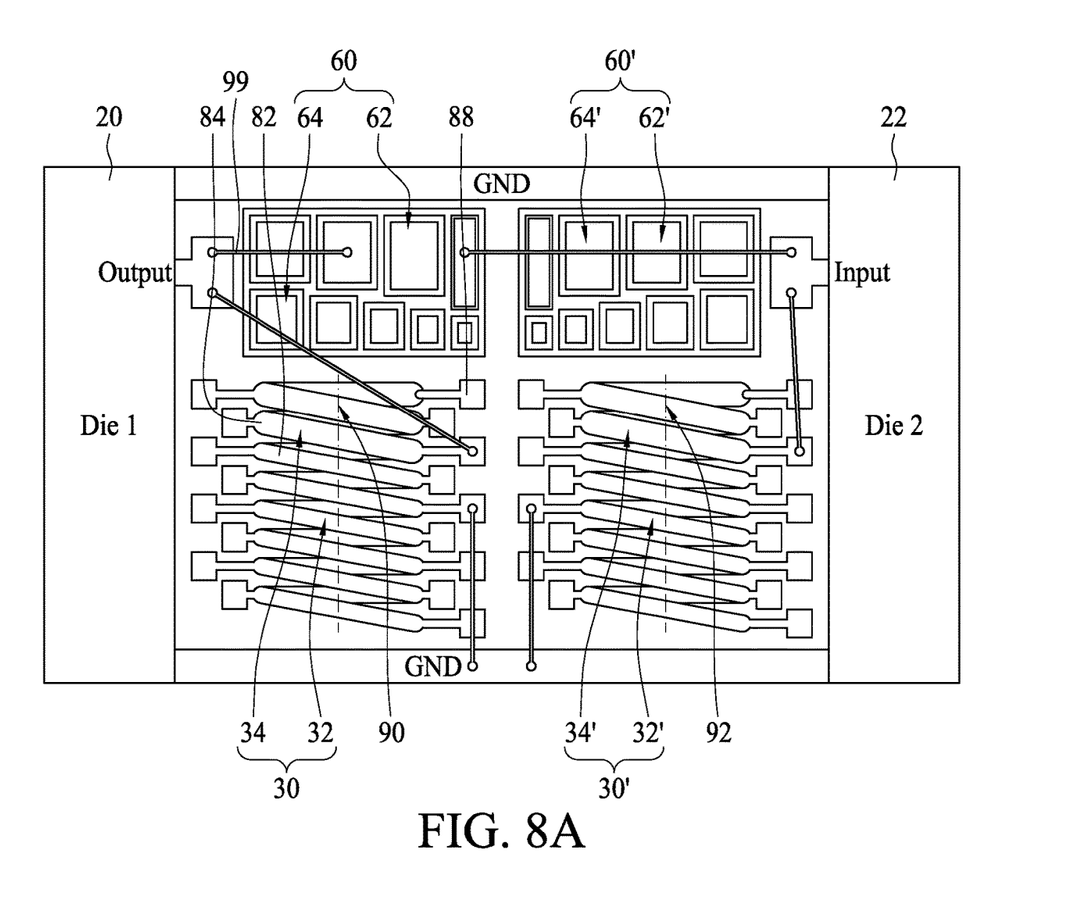
FIG. 8A is a top view of an electrical device in accordance with some embodiments of the present disclosure.

FIG. 8A is a top view of an electrical device 1 in accordance with some embodiments of the present disclosure. The adjustable capacitor 60 is electrically connected to the output and input electrodes through a conductive interconnect structure 99. The output electrode is electrically connected to the die 20. The input electrode is electrically connected to the die 22. The adjustable capacitor 60 is electrically connected to the adjustable inductors 30 and 30'. The adjustable inductors 30 and 30' are electrically connected to the ground. These electrical connections may be implemented, for example, through conductive interconnect structures 99.

Figure 8B:
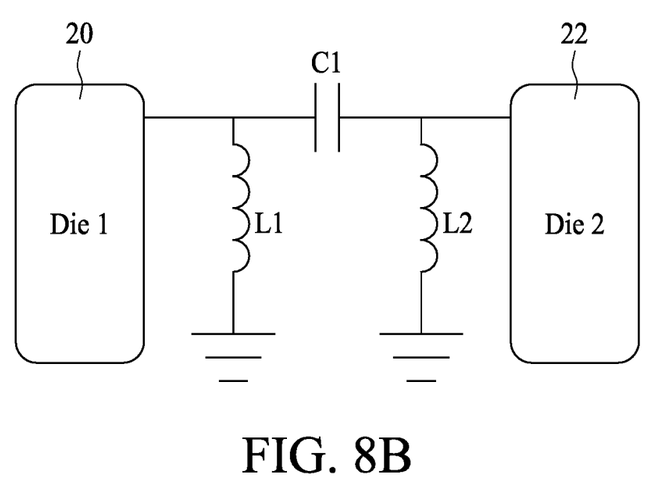
FIG. 8B is a schematic circuit diagram of the electrical device shown in FIG. 8A.

FIG. 8B is a schematic circuit diagram of the electrical device shown in FIG. 8A. Inductors L1 and L2, which may correspond to at least one of the adjustable inductors 30 and 30', are connected in parallel between capacitor C1, which may correspond to at least one of the adjustable capacitors 60 and 60', and a ground. The circuit combination of capacitor C1 and inductors L1 and L2 may be connected between the dies 20 and 22, and the capacitances and inductance values of those components may be set to adjust the impedance between the dies 20 and 22 (e.g. for impedance matching).

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a variation of less than or equal to ±10% of the numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 0° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, the term "approximately equal" or "substantially" the same in reference to two values can refer to a ratio of the two values being within a range between and inclusive of 0.9 and 1.1.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

Two surfaces or sides can be deemed to be aligned if a displacement between the two surfaces is no greater than 0.5 μm, no greater than 1 μm, no greater than 5 μm, no greater than 10 μμm, or no greater than 15 μm. In the description of some embodiments, a component provided "on" another component can encompass cases where the former component is directly on (e.g., in physical contact with) the latter component, as well as cases where one or more intervening components are located between the former component and the latter component.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

While the present disclosure has been described and illustrated with reference to specific embodiments thereof, these descriptions and illustrations do not limit the present disclosure. It should be understood by those skilled in the art that various changes may be made and equivalents may be substituted without departing from the true spirit and scope of the present disclosure as defined by the appended claims. The illustrations may not necessarily be drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. An electrical device, comprising:
   a substrate having a first surface;
   a first dielectric layer disposed on the first surface of the substrate and having a first surface;
   a first die surrounded by the first dielectric layer;
   an adjustable inductor electrically connected to the first die, the adjustable inductor comprising a plurality of pillars surrounded by the first dielectric layer, a plurality of first metal strips disposed on the first surface of the first dielectric layer and electrically connected to the pillars, and a plurality of second metal strips disposed on the first surface of the first dielectric layer and electrically connected to the pillars,
   wherein a width of at least one of the second metal strips is different than a width of at least one of the first metal strips; and
   a second die electrically connected to the adjustable inductor.

2. The electrical device according to claim 1, wherein the adjustable inductor further comprises a contact pad disposed on the first surface of the first dielectric layer and electrically connected to at least one of the first metal strips or at least one of the second metal strips.

3. The electrical device according to claim 2, further comprising a first passivation layer, wherein the adjustable inductor is covered by the first passivation layer, and the first passivation layer defines an opening exposing the contact pad.

4. The electrical device according to claim 3, further comprising a first adjustable capacitor, the first adjustable capacitor comprising at least a first capacitor and a second capacitor, and wherein a capacitance of the first capacitor is different than a capacitance of the second capacitor, and wherein the adjustable inductor is electrically connected to the first adjustable capacitor.

5. The electrical device according to claim 4, further comprising a second dielectric layer disposed on the first surface of the substrate, wherein the first adjustable capacitor is surrounded by the second dielectric layer and wherein the first capacitor comprises a bottom electrode, an insulation layer disposed on the bottom electrode, and a top electrode disposed on the insulation layer.

6. The electrical device according to claim 5, wherein a width of one of the pillars corresponding to one of the second metal strips is different than a width of another one of the pillars corresponding to one of the first metal strips.

7. The electrical device according to claim 4, further comprising a second adjustable capacitor electrically connected to the adjustable inductor.

8. The electrical device according to claim 4, further comprising a second adjustable capacitor, wherein the second adjustable capacitor comprises at least a second capacitor and a third capacitor.

9. An electrical device, comprising:
a substrate having a first surface;
a first adjustable capacitor disposed on the substrate;
a first dielectric layer disposed on the first surface of the substrate, the first dielectric layer surrounding the first adjustable capacitor;
a second dielectric layer disposed on the first dielectric layer;
a first die electrically connected to the first adjustable capacitor;
a first adjustable inductor electrically connected to the first adjustable capacitor, the first adjustable inductor comprising a plurality of pillars, wherein each of the pillars is surrounded by the second dielectric layer; and
a second die electrically connected to the first adjustable inductor.

10. The electrical device according to claim 9, wherein the first adjustable inductor is disposed on the first dielectric layer, and wherein the first adjustable inductor comprises a plurality of first metal strips disposed on a first surface of the first dielectric layer, and a plurality of second metal strips disposed on a first surface of the second dielectric layer, wherein each of the first metal strips is respective connected to one of the second metal strips by one of the pillars.

11. The electrical device according to claim 10, wherein the first adjustable inductor comprises a plurality of third metal strips disposed on the first surface of the first dielectric layer, and a width of at least one of the second metal strips is different than a width of at least one of the first metal strips.

12. The electrical device according to claim 11, wherein the first adjustable inductor further comprises a contact pad disposed on the first surface of the second dielectric layer and electrically connected to at least one of the first metal strips or at least one of the second metal strips.

13. The electrical device according to claim 12, further comprising a first passivation layer, wherein the first adjustable inductor is covered by the first passivation layer, and the first passivation layer defines an opening exposing the contact pad.

14. The electrical device according to claim 13, wherein the first adjustable capacitor comprises a bottom electrode, an insulation layer disposed on the bottom electrode, and a top electrode disposed on the insulation layer.

15. The electrical device according to claim 13, wherein a width of one of the pillars corresponding to one of the second metal strips is greater than a width of another of the pillars corresponding to one of the first metal strips.

16. The electrical device according to claim 10, wherein the first adjustable capacitor comprises at least a first capacitor and a second capacitor, and a capacitance of the first capacitor is different than a capacitance of the second capacitor.

17. The electrical device according to claim 16, further comprising a second adjustable capacitor electrically connected to the first adjustable inductor.

18. The electrical device according to claim 9, further comprising a second adjustable inductor, wherein the first adjustable capacitor is electrically connected to the first adjustable inductor and the second adjustable inductor.

19. An electrical device, comprising:
a substrate having a first surface;
a first adjustable capacitor disposed on the first surface of the substrate;
a first die electrically connected to the first adjustable capacitor;
a first adjustable inductor electrically connected to the first adjustable capacitor, the first adjustable inductor comprising a spiral structure that spirals around a first axis, wherein the first axis passes through the first adjustable capacitor; and
a second die electrically connected to the first adjustable inductor.

20. The electrical device according to claim 19, further comprising a second adjustable capacitor disposed on the first surface of the substrate, wherein the first adjustable capacitor is disposed adjacent to the first die, the second adjustable capacitor is disposed adjacent to the second die, and the first adjustable capacitor is disposed adjacent to the second adjustable capacitor.

21. The electrical device according to claim 20, further comprising a second adjustable inductor, wherein the first adjustable inductor is adjacent to the first die and the second adjustable inductor is adjacent to the second die, and the second adjustable inductor comprises a spiral structure that spirals around a second axis, wherein the second axis passes through the second adjustable capacitor.

22. The electrical device according to claim 21, wherein the first axis is substantially parallel to the second axis.

* * * * *